US009692462B2

(12) United States Patent
Chang

(10) Patent No.: US 9,692,462 B2
(45) Date of Patent: Jun. 27, 2017

(54) TRANSMITTER AND METHOD FOR LOWERING SIGNAL DISTORTION

(71) Applicant: Realtek Semiconductor Corp., HsinChu (TW)

(72) Inventor: Yu-Pin Chang, Tainan (TW)

(73) Assignee: Realtek Semiconductor Corp., HsinChu (TW)

( * ) Notice: Subject to any disclaimer, the term of this patent is extended or adjusted under 35 U.S.C. 154(b) by 0 days.

(21) Appl. No.: 14/975,877

(22) Filed: Dec. 21, 2015

(65) Prior Publication Data

US 2016/0269057 A1  Sep. 15, 2016

(30) Foreign Application Priority Data

Mar. 13, 2015  (TW) .............................. 104108138 A

(51) Int. Cl.
*H04L 25/03* (2006.01)
*H04B 1/04* (2006.01)

(52) U.S. Cl.
CPC ... *H04B 1/0475* (2013.01); *H04B 2001/0425* (2013.01)

(58) Field of Classification Search
CPC ...................... H04B 1/0475; H04B 2001/0425
USPC .................................. 375/297; 330/149, 103
See application file for complete search history.

(56) References Cited

U.S. PATENT DOCUMENTS

| 9,306,506 B1* | 4/2016 | Zhang .................... H03F 1/3247 330/149 |
| 9,385,762 B2* | 7/2016 | Laporte ................. H04B 1/0475 |
| 2011/0036158 A1* | 2/2011 | Oblizajek ............ G01M 17/022 73/146 |
| 2014/0009225 A1* | 1/2014 | Laporte ................. H03F 1/3247 330/103 |
| 2014/0294120 A1 | 10/2014 | Gandhi |
| 2014/0347126 A1* | 11/2014 | Laporte ................. H03F 1/3247 330/149 |
| 2015/0103952 A1* | 4/2015 | Wang .................... H04L 27/368 375/297 |

FOREIGN PATENT DOCUMENTS

WO      2013165288 A1      11/2013

OTHER PUBLICATIONS

Smith, Steven W. "The scientist and engineer's guide to digital signal processing." Chapter 21, PDF version (1997).*

* cited by examiner

*Primary Examiner* — Daniel Washburn
*Assistant Examiner* — Fitwi Hailegiorgis
(74) *Attorney, Agent, or Firm* — Winston Hsu

(57) ABSTRACT

A transmitter includes a first pre-distortion circuit, a second pre-distortion circuit, a transmitting circuit and a pre-distortion parameters generating circuit. The first pre-distortion circuit uses a plurality of first pre-distortion parameters to perform a pre-distortion operation upon a first input signal to generate a pre-distorted first input signal. The second pre-distortion circuit uses a plurality of second pre-distortion parameters to perform a pre-distortion operation upon a second input signal to generate a pre-distorted second input signal. The transmitting circuit is arranged to process the pre-distorted first input signal and the pre-distorted second input signal to generate an output signal. The pre-distortion parameters generating circuit generates the first pre-distortion parameters and the second pre-distortion parameters according to the first input signal, the second input signal and the output signal.

12 Claims, 3 Drawing Sheets

TRANSMITTER AND METHOD FOR LOWERING SIGNAL DISTORTION

BACKGROUND OF THE INVENTION

1. Field of the Invention

The present invention relates to a transmitter which can lower output signal distortion, and an associated method.

2. Description of the Prior Art

In wireless communication systems, a transmitter has a power amplifier at the output terminal for amplifying a signal to be transmitted before outputting it. Because the power amplifier has reduced linearity when the input power is strong, nonlinear distortion occurs which affects the data correctness of the outputted amplified signal. Therefore, prior art methods install a pre-distortion circuit before the power amplifier to compensate for this non-linear distortion. FIG. 1 is a diagram illustrating a pre-distortion circuit 110 and a power amplifier 120 and an input versus output curve. As shown in FIG. 1, the linearity between the input signal V1 and the output signal V3 for the whole circuit (including the pre-distortion circuit 110 and the power amplifier 120) is improved, which increases the data correctness of the output signal V3.

In Orthogonal Frequency-Division Multiplexing (OFDM) of third and fourth generation wideband wireless communication, a power amplifier with high power has a memory effect as well as the non-linearity issue, where the response of the power amplifier corresponding to the current input is related to the prior input. In addition, carrier aggregation techniques developed for Long Term Evolution-Advanced (LTE-A) mean that bigger challenges must be overcome when compensating non-linearity of the power amplifier.

SUMMARY OF THE INVENTION

One of the objectives of the present invention is to provide a transmitter and a method for lowering the input signal distortion, which can correctly compensate the non-linearity of the power amplifier.

According to an embodiment of the present invention, a transmitter is disclosed. The transmitter comprises a first pre-distortion circuit, a second pre-distortion circuit, a transmitting circuit and a pre-distortion parameters generating circuit. The first pre-distortion circuit uses a plurality of first pre-distortion parameters to perform a pre-distortion operation upon a first input signal to generate a first pre-distorted input signal; the second pre-distortion circuit uses a plurality of second pre-distortion parameters to perform a pre-distortion operation upon a second input signal to generate a second pre-distorted input signal; the transmitting circuit is arranged to process the pre-distorted first input signal and the pre-distorted second input signal to generate an output signal; and the pre-distortion parameters generating circuit generates the first pre-distortion parameters and the second pre-distortion parameters according to the first input signal, the second input signal and the output signal.

According to another embodiment of the present invention, a method for lowering an input signal distortion comprises: receiving a first input signal and using a plurality of first pre-distortion parameters to perform a pre-distortion operation upon the first input signal to generate a first pre-distorted input signal; receiving a second input signal and using a plurality of second pre-distortion parameters to perform a pre-distortion operation upon the second input signal to generate a second pre-distorted input signal; processing the first pre-distorted input signal and the second pre-distorted input signal to generate an output signal; and generating the plurality of first pre-distortion parameters and the plurality of second pre-distortion parameters according to the first input signal, the second input signal and the output signal.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should not be interpreted as a close-ended term such as "consist of". Also, the term "couple" is intended to mean either an indirect or direct electrical connection. Accordingly, if one device is coupled to another device, that connection may be through a direct electrical connection, or through an indirect electrical connection via other devices and connections.

Figure 1:
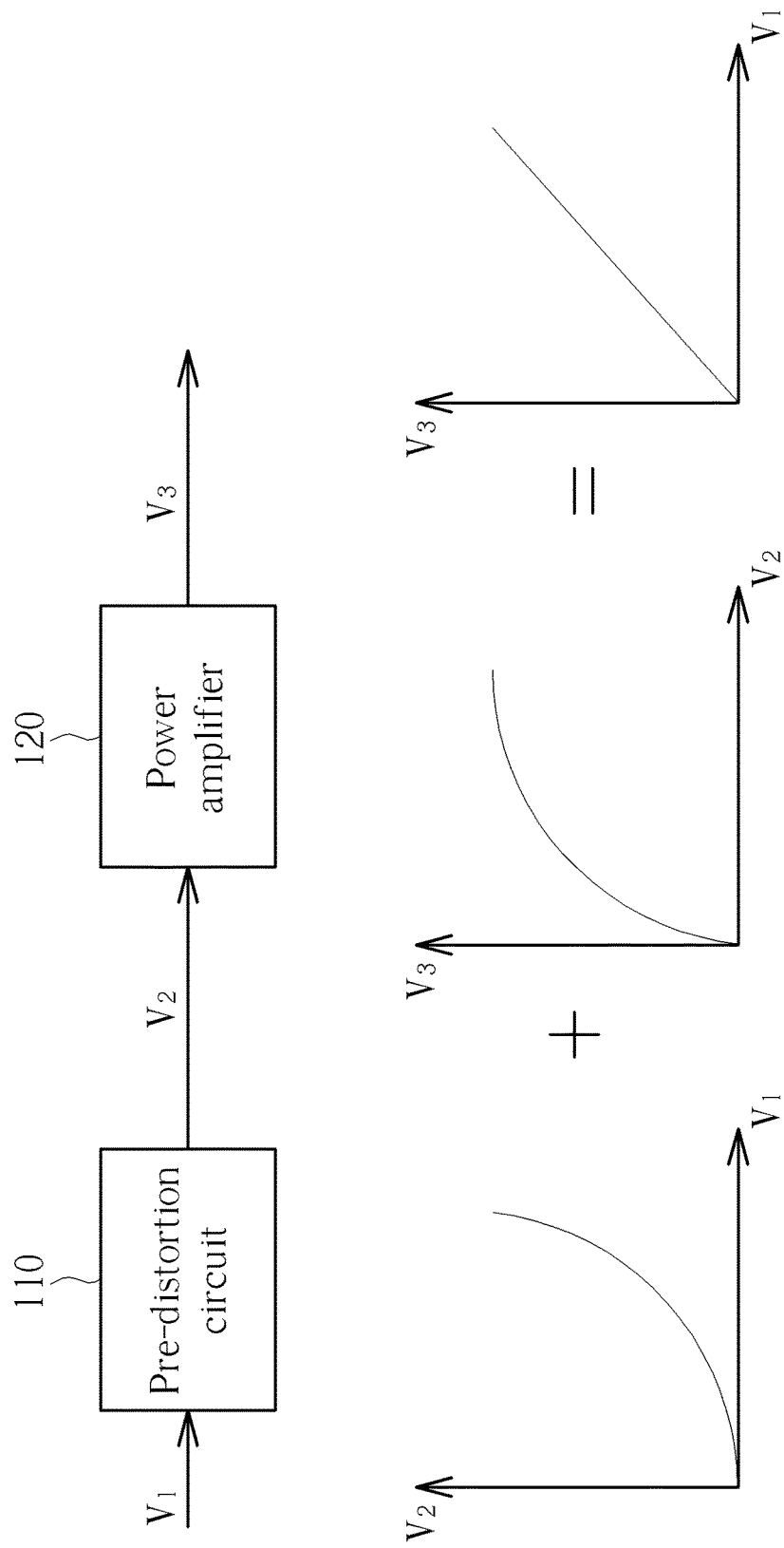
FIG. 1 is a diagram illustrating a pre-distortion circuit 110 and a power amplifier 120 and input versus output curve therefor.
Figure 2:
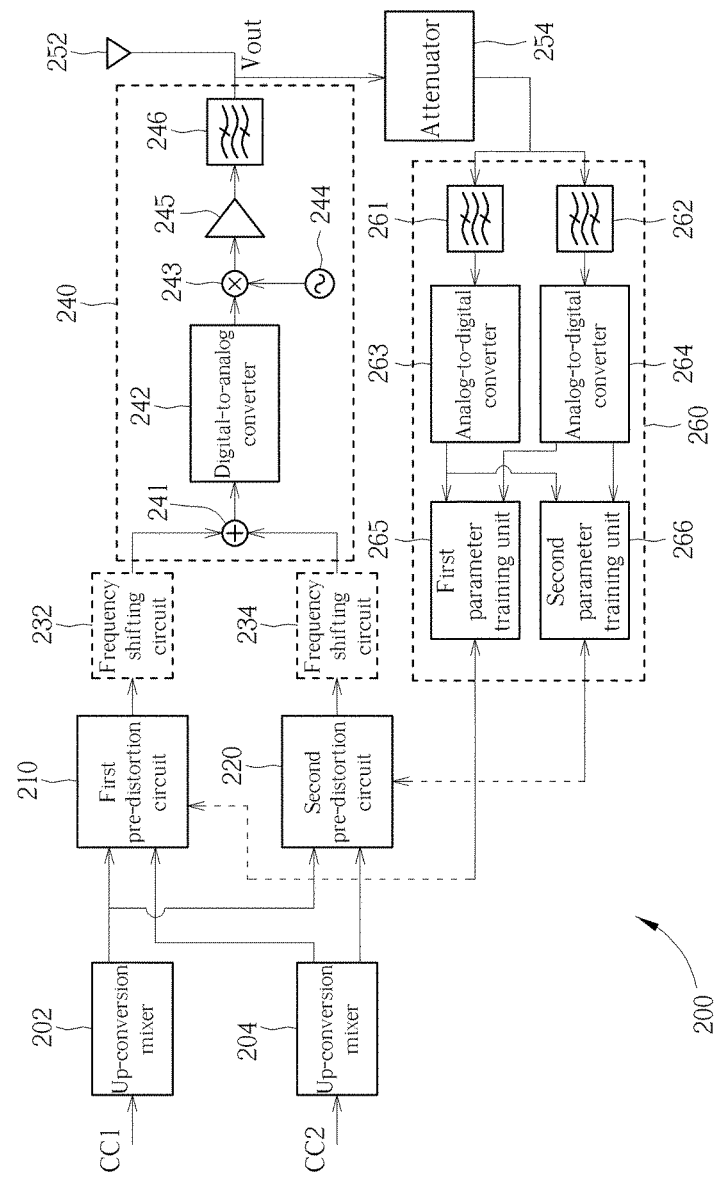
FIG. 2 is a diagram illustrating a transmitter according to an embodiment of the present invention.

FIG. 2 is a diagram illustrating a transmitter 200 according to an embodiment of the present invention. As shown in FIG. 2, the transmitter 200 comprises up-conversion mixers 202, 204, a first pre-distortion circuit 210, a second pre-distortion processing 220, frequency shifting circuits 232, 234, a transmitting circuit 240, an antenna 252, an attenuator 254 and a pre-distortion parameter generating circuit 260, wherein the transmitting circuit 240 comprises a polymerized circuit 241, a digital-to-analog converter 242, a mixer 243, an oscillator 244, a power amplifier 245 and an analog filter 246, and the pre-distortion parameter generating circuit 260 comprises a first digital filter 261, a second digital filter 262, a first analog-to-digital converter 263, a second analog-to-digital converter 264, a first parameter training unit 265 and a second parameter training unit 266. In addition, the power amplifier 245 and the analog filter 246 shown in FIG. 2 can switch positions according to the designer's preference, and are not limited to the sequence shown in FIG. 2. In this embodiment, the transmitter 200 can be applied in the LTE-A, but this is not a limitation of the present invention.

In the operation of the transmitter 200, after the frequency of the first input signal CC1 is elevated by the up-conversion mixer 202, the first input signal CC1 is inputted to the first pre-distortion circuit 210 and the second pre-distortion circuit 220; after the frequency of the second input signal CC2 is elevated by the up-conversion mixer 204, the second input signal CC2 is inputted to the first pre-distortion circuit 210 and the second pre-distortion circuit 220. In this embodiment, the first input signal CC1 and the second input signal CC2 can be carrier signals with adjacent frequencies in a frequency band, or carrier signals with non-adjacent frequencies; in addition, in a situation where the transmitter 200 corresponds to the spec of the LTE-A, the first input signal CC1 is a component carrier of a carrier aggregation, and the second input signal CC2 is another component carrier of the carrier aggregation.

In the operation of the first pre-distortion circuit 210, the first pre-distortion circuit 210 uses a plurality of first pre-distortion parameters to perform a pre-distortion operation upon the first input signal CC1 to generate a first pre-distorted input signal. In this embodiment, the operation of the first pre-distortion circuit 210 comprises some non-linear adjusting and zero-phase filtering, as represented by the following equation (1):

$$y_1 = \sum_{p=0}^{M} \sum_{k=0}^{N} \sum_{j=0}^{k} a_{p,k,j}^{(1)} F(x_1(n-p)|x_1(n-p)|^{k-j}|x_2(n-p)|^j) \quad (1)$$

$$= \sum_{p=0}^{M} \sum_{k=0}^{N} \sum_{j=0}^{k} a_{p,k,j}^{(1)} \left[ \sum_{t=0}^{T} x_1(n-p-t)|x_1(n-p-t)|^{k-j} |x_2(n-p-t)|^j f(t) \right]$$

wherein y1 is the first pre-distorted input signal outputted by the first pre-distortion circuit 210; x1 is the first input signal CC1 processed by the up-conversion mixer 202; x2 is the second input signal CC2 processed by the up-conversion mixer 204; p is depth of memory; k is non-linearity order for calibrating x1; j is non-linearity order of x2 (i.e. the affect caused by the second input signal CC2 corresponding to the first input signal CC1); M is a positive value representing the maximum depth of memory; N is a positive value representing the calibrated maximum non-linearity orders; $a_{p,k,j}^{(1)}$ is a plurality of first pre-distortion parameters corresponding to different p, k, j; and f (t) is any function of zero-phase filter or FIR filter corresponding to this circuit.

Similarly, in the operation of the second pre-distortion circuit 220, the second pre-distortion circuit 220 uses a plurality of second pre-distortion parameters to perform a pre-distortion operation upon the second input signal CC2 to generate a second pre-distorted input signal. In this embodiment, the operation of the second pre-distortion circuit 220 comprises some non-linear adjusting and zero-phase filtering, as represented by the following equation (2):

$$y_2 = \sum_{p=0}^{M} \sum_{k=0}^{N} \sum_{j=0}^{k} a_{p,k,j}^{(2)} F(x_2(n-p)|x_2(n-p)|^{k-j}|x_1(n-p)|^j) \quad (2)$$

$$= \sum_{p=0}^{M} \sum_{k=0}^{N} \sum_{j=0}^{k} a_{p,k,j}^{(2)} \left[ \sum_{t=0}^{T} x_2(n-p-t)|x_2(n-p-t)|^{k-j} |x_1(n-p-t)|^j f(t) \right]$$

wherein y2 is the second pre-distorted input signal outputted by the second pre-distortion circuit 220; x1 is the second input signal CC2 processed by the up-conversion mixer 202; x2 is the second input signal CC2 processed by the up-conversion mixer 204; p is depth of memory; k is non-linearity order for calibrating x2; j is non-linearity order of x1 (i.e. the affect caused by the first input signal CC1 corresponding to the second input signal CC2); M is a positive value representing the maximum depth of memory; N is a positive value representing the calibrated maximum non-linearity orders; $a_{p,k,j}^{(1)}$ is a plurality of second pre-distortion parameters corresponding to different p, k, j; and f(t) is any function of zero-phase filter or FIR filter corresponding to this circuit.

The frequency shifting circuits 232, 234 perform frequency shift operations upon the first pre-distorted input signal and the second pre-distorted input signal outputted by the first pre-distortion circuit 210 and the second pre-distortion circuit 220. It should be noted that the frequency shifting circuits 232, 234 are optional elements; in some situations, the frequency shifting circuits 232, 234 can be removed from the transmitter 200 without affecting the operation.

Next, in the operation of the transmitting circuit 240, the polymerized circuit 241 performs polymerization on the first pre-distorted input signal and the second pre-distorted input signal outputted by the first pre-distortion circuit 210 and the second pre-distortion circuit 220, to polymerize two carrier signals together; and the digital-to-analog converter 242 performs digital-to-analog conversion on the polymerized signal. The mixer 243 uses an oscillation signal outputted by the oscillator 244 to perform a mix operation on the output of the digital-to-analog converter 242; the power amplifier 245 and the filter 246 perform power amplifying operation and filtering operations on the output of the mixer 243 to generate an output signal Vout, and the output signal Vout is emitted by the antenna 252.

The abovementioned operations concern the transmitter 200 transmitting the carriers, and the following attenuator 254 and pre-distortion parameter generating circuit 260 are arranged to generate the plurality of first pre-distortion parameters and the plurality of second pre-distortion parameters used by the first pre-distortion circuit 210 and the second pre-distortion processing 220, i.e. the $a_{p,k,j}^{(1)}$ and $a_{p,k,j}^{(2)}$ mentioned in the above equations.

In the operation of the pre-distortion parameter generating circuit 260, the attenuator 254 receives the output signal Vout, and lowers the power. Next, the first digital filter 261 filters the attenuated output signal Vout to generate a first filtered signal, wherein the frequency band allowed by the first digital filter 261 comprises the content of the first input signal CC1; similarly, the second digital filter 262 filters the attenuated output signal Vout to generate a second filtered signal, wherein the frequency band allowed by the second digital filter 262 comprises the content of the second input signal CC2. The first analog-to-digital converter 263 and the second analog-to-digital converter 264 perform analog-to-digital conversion on the outputs of the first digital filter 261 and the second digital filter 262, respectively. The first parameter training unit 265 generates a plurality of first pre-distortion parameters according to the first input signal, the second input signal and the outputs of the first analog-to-digital converter 263 and the second analog-to-digital converter 264, i.e. the $a_{p,k,j}^{(1)}$ mentioned in the equation; and the second parameter training unit 266 generates a plurality of second pre-distortion parameters according to the first input signal, the second input signal and the outputs of the first analog-to-digital converter 263 and the second analog-to-digital converter 264, i.e. the $a_{p,k,j}^{(2)}$ mentioned in the equation.

In this embodiment, the first parameter training unit 265 and the second parameter training unit 266 utilize least square or any other suitable method to determine the plurality of first pre-distortion parameters and the plurality of second pre-distortion parameters.

In the transmitter 200, the pre-distortion parameter generating circuit 260 can actively generate the plurality of first pre-distortion parameters and the plurality of second pre-distortion parameters during front end testing, and store these parameters in a register in advance for the first pre-distortion circuit 210 and the second pre-distortion processing 220 in the following operations of the transmitter 200. The pre-distortion parameter generating circuit 260 can also perform parameter training during the operation of the transmitter 200 to generate a plurality of first pre-distortion parameters and the plurality of pre-distortion parameters. These alternative designs fall within the scope of the present invention.

In the transmitter 200 shown in FIG. 2, the first pre-distortion circuit 210 and the first parameter training unit 265 are drawn as two independent elements; in order to save manufacturing costs, however, at least a part of the circuit can be shared by the first pre-distortion circuit 210 and the first parameter training unit 265, so that the first pre-distortion circuit 210 and the first parameter training unit 265 comprise the same circuit. Referring to equation (1), the first pre-distortion processing 210 and the first parameter training unit 265 can utilize the same non-linearity adjusting circuit and zero-phase filter, but input/output need to be switched when different elements are operating it some corresponding modification must be performed. Similarly, the second pre-distortion circuit 220 and the second parameter training unit 266 can also comprise the same circuit to reduce manufacturing costs by sharing the same non-linearity adjusting circuit and the zero-phase filter.

In this embodiment, referring to equation (1), the first pre-distortion processing 210 comprises the non-linearity adjusting circuit and the zero-phase filter. In this embodiment, the band allowed by the zero-phase filter is not greater than the band allowed by the analog filter 246; therefore, the first pre-distortion processing 210 with a zero-phase filter can prevent compensation of the pre-distortion from being filtered by the backend analog filter 246 and causing incomplete non-linearity compensation. Because the phase shift of the signal may affect the non-linearity compensation, utilizing the zero-phase filter can make the first pre-distortion processing 210 correctly compensate the non-linearity effect caused by the backend power amplifier 215.

Figure 3:
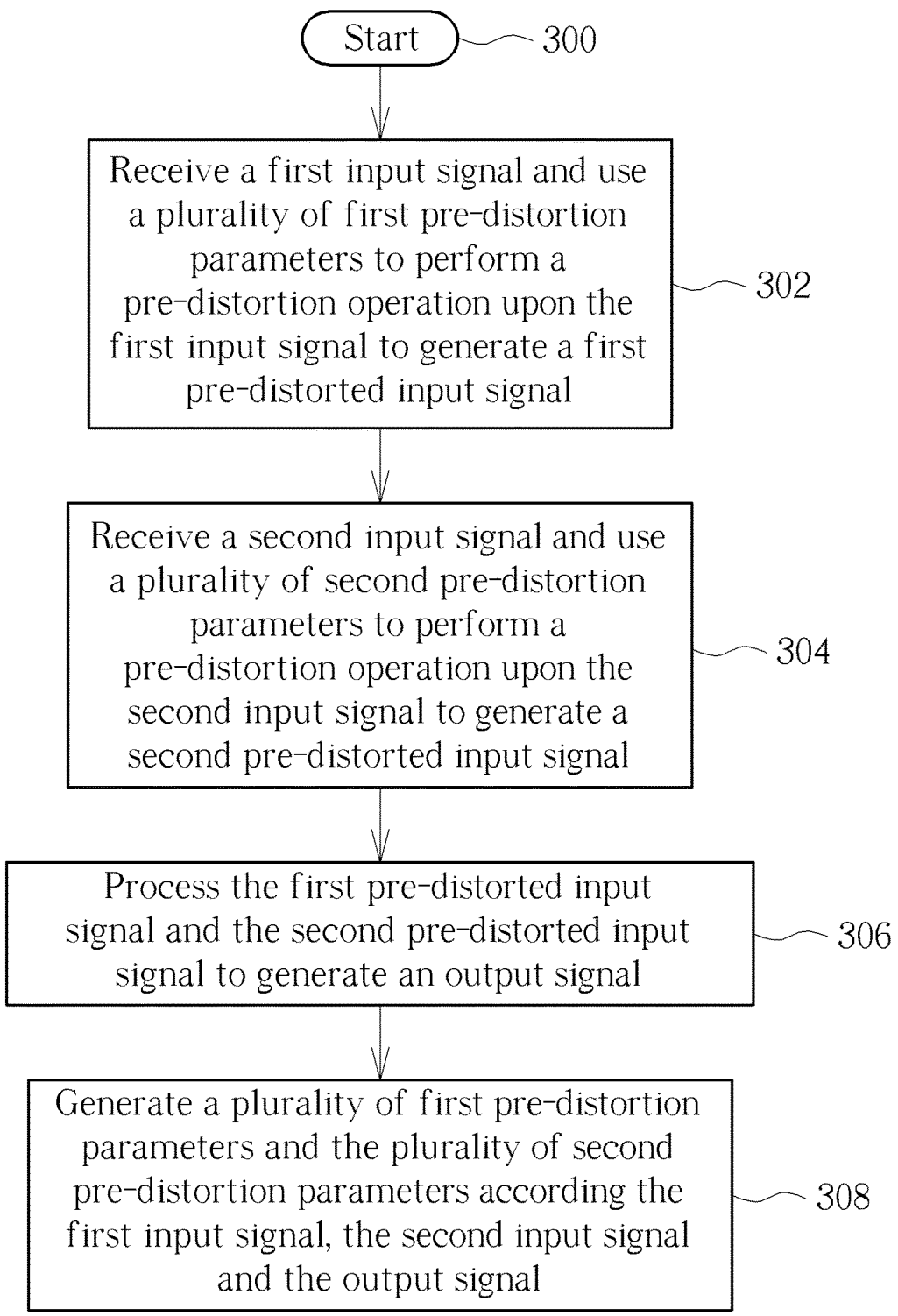
FIG. 3 is a flowchart illustrating a method for lowering an input signal distortion according to an embodiment of the present invention.

FIG. 3 is a flowchart illustrating a method for lowering an input signal distortion according to an embodiment of the present invention. The flow is described as follows:

Step 300: start.
Step 302: receive a first input signal and use a plurality of first pre-distortion parameters to perform a pre-distortion operation upon the first input signal to generate a first pre-distorted input signal.
Step 304: receive a second input signal and use a plurality of second pre-distortion parameters to perform a pre-distortion operation upon the second input signal to generate a second pre-distorted input signal.
Step 306: process the first pre-distorted input signal and the second pre-distorted input signal to generate an output signal.
Step 308: generate a plurality of first pre-distortion parameters and the plurality of second pre-distortion parameters according the first input signal, the second input signal and the output signal.

With regards to a simulation result of the embodiment shown in FIG. 2, under the Intra-band Continuous mode and the Intra-band Non-Continuous mode, the Error Vector Magnitude (EVM) and the Adjacent Channel Leakage Power Ratio (ACLR) are obviously improved compared to the prior art.

Briefly summarized, the transmitter and method for lowering input signal distortion according to the present invention mean that non-linearity problems of the power amplifier such as memory effect and adjacent channel interference can be correctly compensated via the pre-distortion circuit design to thereby enhance data correctness of the input signal.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A transmitter, comprising:
a first pre-distortion circuit, arranged to receive a first input signal and a second input signal, and use a plurality of first pre-distortion parameters and the second input signal to perform a pre-distortion operation upon the first input signal to generate a first pre-distorted input signal;
a second pre-distortion circuit, arranged to receive the first input signal and the second input signal, and use a plurality of second pre-distortion parameters and the first input signal to perform a pre-distortion operation upon the second input signal to generate a second pre-distorted input signal;
a transmitting circuit, coupled to the first pre-distortion circuit and the second pre-distortion circuit, and arranged to process the first pre-distorted input signal and the second pre-distorted input signal to generate an output signal; and
a pre-distortion parameter generating circuit, coupled to the first pre-distortion circuit, the second pre-distortion circuit and the transmitting circuit, and arranged to generate the plurality of first pre-distortion parameters and the plurality of second pre-distortion parameters according to the first input signal, the second input signal and the output signal;
wherein the pre-distortion parameter generating circuit comprises:
a first filter, arranged to perform filtering on the output signal to generate a first filtered signal, wherein a band allowed by the first filter comprises a content of the first input signal;
a second filter, arranged to perform filtering on the same output signal to generate a second filtered signal, wherein a band allowed by the second filter comprises a content of the second input signal, and the first filter and the second filter work simultaneously;
a first analog-to-digital converter, coupled to the first filter, and the first analog-to-digital converter is arranged to perform analog-to-digital conversion on the first filtered signal;
a second analog-to-digital converter, coupled to the second filter, and the second analog-to-digital converter is arranged to perform analog-to-digital conversion on the second filtered signal;
a first parameter training unit, coupled to the first analog-to-digital converter and the second analog-to-digital converter, and arranged to generate the plurality of first pre-distortion parameters according to the first input signal, the second input signal and outputs of the first analog-to-digital converter and the second analog-to-digital converter; and a second parameter training unit, coupled to the first analog-to-digital converter and the second analog-to-digital converter, and arranged to generate the plurality of second pre-distortion parameters according to the first input signal, the second input signal and outputs of the first analog-to-digital converter and the second analog-to-digital converter.

2. The transmitter of claim 1, wherein at least one of the first pre-distortion circuit and the second pre-distortion circuit comprises a digital zero-phase filter.

3. The transmitter of claim 2, wherein the transmitting circuit comprises an analog filter, and a band allowed by the digital zero-phase filter is not greater than a band allowed by the analog filter.

4. The transmitter of claim 1, wherein the first pre-distorted circuit and the first parameter training unit comprise a same circuit.

5. The transmitter of claim 4, wherein the first pre-distortion circuit comprises a digital zero-phase filter, and the first parameter training unit comprises the digital zero-phase filter.

6. The transmitter of claim 1, wherein the first input signal is a component carrier of a carrier aggregation, and the second input signal is another component carrier of a carrier aggregation.

7. A method for lowering an input signal distortion, comprising:
receiving a first input signal and a second input signal, and using a plurality of first pre-distortion parameters and the second input signal to perform a pre-distortion operation upon the first input signal to generate a first pre-distorted input signal;
receiving the first input signal and the second input signal, and using a plurality of second pre-distortion parameters and the first input signal to perform a pre-distortion operation upon the second input signal to generate a second pre-distorted input signal;
processing the first pre-distorted input signal and the second pre-distorted input signal to generate an output signal;
generating the plurality of first pre-distortion parameters and the plurality of second pre-distortion parameters according to the first input signal, the second input signal and the output signal;
wherein the steps of generating the plurality of first pre-distortion parameters and the plurality of pre-distortion parameters comprise:
performing a first filtering operation on the output signal to generate a first filtered signal, wherein the first filtered signal comprises a content of the first input signal;
performing a second filtering operation on the same output signal to generate a second filtered signal, wherein the second filtered signal comprises a content of the second input signal, wherein the first filtering operation and the second filtering operation are performed simultaneously;
performing an analog-to-digital conversion on the first filtered signal to generate a digital first filtered signal;
performing an analog-to-digital conversion on the second filtered signal to generate a digital second filtered signal;
generating the plurality of first pre-distortion parameters according to the first input signal, the second input signal, the digital first filtered signal and the digital second filtered signal; and
generating the plurality of second pre-distortion parameters according to the first input signal, the second input signal, the digital first filtered signal and the digital second filtered signal.

8. The method of claim 7, wherein the steps of generating the first pre-distorted input signal comprise:
using a circuit which comprises a digital zero-phase filter to perform the pre-distortion operation upon the first input signal to generate the first pre-distorted input signal.

9. The method of claim 8, wherein the steps of processing the first pre-distorted input signal and the second pre-distorted input signal to generate the output signal comprise an analog filtering operation, and a band allowed by the digital zero-phase filter is not greater than a band allowed by the analog filtering operation.

10. The method of claim 7, wherein the steps of generating the first pre-distorted input signal and the steps of generating the plurality of first pre-distortion parameters use the same circuit.

11. The method of claim 10, wherein the steps of generating the first pre-distorted input signal are performed by a circuit comprising a digital zero-phase filter, and the steps of generating the plurality of first pre-distortion parameters are performed by the circuit comprising the digital zero-phase filter.

12. The method of claim 7, wherein the first input signal is a component carrier of a carrier aggregation, and the second input signal is another component carrier of a carrier aggregation.

* * * * *